United States Patent
Kim et al.

(10) Patent No.: US 8,735,893 B2
(45) Date of Patent: May 27, 2014

(54) VISIBLE SENSING TRANSISTOR, DISPLAY PANEL AND MANUFACTURING METHOD THEREOF

(71) Applicant: Samsung Display Co., Ltd., Yongin (KR)

(72) Inventors: Dae-Cheol Kim, Suwon-si (KR); Sung-Ryul Kim, Asan-si (KR); Yung-Jong Yeo, Seoul (KR); Hong-Kee Chin, Suwon-si (KR); Ki-Hun Jeong, Cheongan-si (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/872,605

(22) Filed: Apr. 29, 2013

(65) Prior Publication Data

US 2013/0234142 A1  Sep. 12, 2013

Related U.S. Application Data

(62) Division of application No. 13/208,040, filed on Aug. 11, 2011, now Pat. No. 8,450,740.

(30) Foreign Application Priority Data

Aug. 12, 2010 (KR) .................. 10-2010-0077962

(51) Int. Cl.
*H01L 29/04* (2006.01)

(52) U.S. Cl.
USPC .................... 257/59; 257/53; 257/55; 257/72

(58) Field of Classification Search
USPC .......................................... 257/53, 55, 59, 72
See application file for complete search history.

(56) References Cited

U.S. PATENT DOCUMENTS

| 5,757,453 A | 5/1998 | Shin et al. |
| 2008/0001154 A1 | 1/2008 | Lee |

OTHER PUBLICATIONS

Notice of Allowance in U.S. Appl. No. 13/208,040 dated Mar. 20, 2013.

*Primary Examiner* — Tan N Tran
(74) *Attorney, Agent, or Firm* — H.C. Park & Associates, PLC

(57) ABSTRACT

A display device includes an infrared sensing transistor and a visible sensing transistor. The visible sensing transistor includes a semiconductor on a substrate; an ohmic contact on the semiconductor; an etch stopping layer on the ohmic contact; a source electrode and a drain electrode on the etch stopping layer; a passivation layer on the source electrode and the drain electrode; and a gate electrode on the passivation layer. The etch stopping layer may be composed of the same material as the source electrode and the drain electrode. The infrared sensing transistor is similar to the visible sensing transistor except the etch stopping layer is absent.

14 Claims, 7 Drawing Sheets

VISIBLE SENSING TRANSISTOR, DISPLAY PANEL AND MANUFACTURING METHOD THEREOF

CROSS REFERENCE TO RELATED APPLICATION

This application is a divisional of U.S. patent application Ser. No. 13/208,040, filed on Aug. 11, 2011, and claims priority from and the benefit of Korean Patent Application No. 10-2010-0077962, filed on Aug. 12, 2010, which are hereby incorporated by reference for all purposes as if fully set forth herein.

BACKGROUND OF THE INVENTION

1. Field of the Invention

Exemplary embodiments of the present invention relate to a visible sensing transistor, display panel, and a method of manufacturing the same.

2. Discussion of the Background

Many kinds of flat panel displays are being developed and used. Among them, a liquid crystal display is widely used in many ways.

Liquid crystal displays may include a touch sensor or an image sensor. However, such liquid crystal displays may require dual sensors, e.g., a visible sensing transistor and an infrared sensing transistor, to implement the touch sensing and image sensing functions.

Since the features obtained from the infrared sensing transistor and the visible sensing transistor may be different from each other, materials used for the semiconductors in the infrared sensing transistor and the visible sensing transistor may differ. To separate processes for preparing the two semiconductors, an etch stopping layer may be employed.

However, as the thickness of an etch stopping layer increases, etching of a thin film that is formed on the etch stopping layer may not properly occur, which might cause defects in the etched patterns. If defects arise due to formation of the etch stopping layer, leakage current may be generated in the transistors and the etch stopping layer, thereby deteriorating electrical properties of the liquid crystal display.

Information disclosed in this section is for understanding of the background of the invention and may contain information that does not form the prior art.

SUMMARY OF THE INVENTION

Exemplary embodiments of the present invention provide a display panel and a method for manufacturing the same that may have improved electrical properties of light sensing transistors.

Exemplary embodiments of the present invention also provide prevention of defective patterns in a display panel using a small number of processes.

Exemplary embodiments of the present invention additionally provide a display panel having decreased leakage current and containing light sensing transistors.

Additional features of the invention will be set forth in the description which follows, and in part will be apparent from the description, or may be learned by practice of the invention.

An exemplary embodiment of the present invention discloses a light sensing transistor that comprises a semiconductor disposed on a substrate; an ohmic contact disposed on the semiconductor; an etch stopping layer disposed on the ohmic contact; a source electrode and a drain electrode both disposed on the etch stopping layer; a passivation layer disposed on the source electrode and the drain electrode; and a gate electrode disposed on the passivation layer. The etch stopping layer, the source electrode, and the drain electrode are comprised of a same material.

An exemplary embodiment of the present invention also discloses a display panel that comprises a light blocking layer disposed on a substrate; an insulating layer disposed on the light blocking layer; a buffer layer and a first light sensing transistor both disposed on the insulating layer; and a second light sensing transistor disposed on the buffer layer. The first light sensing transistor comprises a first semiconductor disposed on the insulating layer; an ohmic contact disposed on the semiconductor; an etch stopping layer disposed on the ohmic contact; and a source electrode and a drain electrode both disposed on the etch stopping layer. The etch stopping layer, the source electrode, and the drain electrode are comprised of a same material, and the first light sensing transistor and the second light sensing transistor sense different wavelengths.

An exemplary embodiment of the present invention additionally discloses a method for manufacturing a display panel. The method comprises forming a light blocking layer on a substrate; forming an insulating layer on the light blocking layer; forming a first semiconductor of a first light sensing transistor on the insulating layer, and a first ohmic contact pattern, a first etch stopping pattern, and a second etch stopping pattern on the first semiconductor; forming a buffer layer on the insulating layer, a second semiconductor of a second light sensing transistor on the buffer layer, and a second ohmic contact pattern on the second semiconductor; exposing the first etch stopping pattern by removing the second etch stopping pattern after forming the first ohmic contact pattern or the second ohmic contact pattern; forming a source electrode and a drain electrode of the first light sensing transistor and a source electrode and a drain electrode of the second light sensing transistor on the first etch stopping pattern and the second ohmic contact pattern, respectively; forming an etch stopping layer and a first ohmic contact by etching the first etch stopping pattern and the first ohmic contact pattern using the source electrode and the drain electrode of the first light sensing transistor as a mask; and forming a second ohmic contact by etching the second ohmic contact pattern using the source electrode and the drain electrode of the second light sensing transistor as a mask. The first etch stopping pattern, the source electrode and the drain electrode of the first light sensing transistor, the source electrode and the drain electrode of the second light sensing transistor are comprised of a same material, and the first light sensing transistor and the second light sensing transistor sense different wavelengths.

An exemplary embodiment of the present invention further discloses a method for manufacturing a display panel. The method comprises forming a light blocking layer on a substrate; forming an insulating layer on the light blocking layer; forming an amorphous silicon layer, a silicon layer comprising a conductive impurity, a first etch stopping layer and a second etch stopping layer on the insulating layer; forming a photoresist pattern on the second etch stopping layer; forming a second etch stopping pattern, a first etch stopping pattern, a first ohmic contact pattern, and a first semiconductor of a first light sensing transistor by etching the second etch stopping layer, the first etch stopping layer, the silicon layer, and the amorphous silicon layer using the photoresist pattern as a mask; exposing the first etch stopping pattern by removing the second etch stopping pattern; forming a buffer layer on the insulating layer, a second semiconductor of a second light sensing transistor on the buffer layer, and a second ohmic contact pattern on the second semiconductor; forming a source electrode and a drain electrode of the first light sensing transistor and a source electrode and a drain electrode of the second light sensing transistor on the first etch stopping pattern and the second ohmic contact pattern, respectively; forming an etch stopping layer and a first ohmic contact by etching the first etch stopping pattern and the first ohmic contact pattern using the source electrode and the drain electrode of the first light sensing transistor as a mask; and forming a second ohmic contact by etching the second ohmic contact pattern using the source electrode and the drain electrode of the second light sensing transistor as the mask. The first etch stopping pattern, the source electrode and the drain electrode of the first light sensing transistor, and the source electrode and the drain electrode of the second light sensing transistor are comprised of a same material.

An exemplary embodiment of the present invention also discloses a method for manufacturing a display panel. The method comprises forming a light blocking layer on a substrate; forming an insulating layer on the light blocking layer; forming a first semiconductor of a first light sensing transistor on the insulating layer, a first ohmic contact pattern, a first etch stopping pattern, and a second etch stopping pattern on the first semiconductor; forming a buffer layer on the insulating layer, a second semiconductor of a second light sensing transistor on the buffer layer, and a second ohmic contact pattern on the second semiconductor; exposing the first etch stopping pattern by removing the second etch stopping pattern after forming the second ohmic contact pattern; forming a source electrode and a drain electrode of the first light sensing transistor and a source electrode and a drain electrode of the second light sensing transistor on the first etch stopping pattern and the second ohmic contact pattern, respectively; forming an etch stopping layer and a first ohmic contact by etching the first etch stopping pattern and the first ohmic contact pattern using the source electrode and the drain electrode of the first light sensing transistor as a mask; and forming a second ohmic contact by etching the second ohmic contact pattern using the source electrode and the drain electrode of the second light sensing transistor as a mask. The first etch stopping pattern, the source electrode and the drain electrode of the first light sensing transistor, and the source electrode and the drain electrode of the second light sensing transistor are comprised of a same material.

An exemplary embodiment of the present invention additionally discloses a display device that comprises a first light sensing transistor disposed on a substrate; a light blocking layer disposed on the substrate and a second light sensing transistor disposed on the substrate and overlapping the light blocking layer. The second light sensing transistor comprises a first gate electrode disposed on the light blocking layer and a second gate electrode overlapping the light blocking layer and electrically connected to the first gate electrode. The first light sensing transistor senses visible wavelengths, and the second light sensing transistor senses infrared wavelengths.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
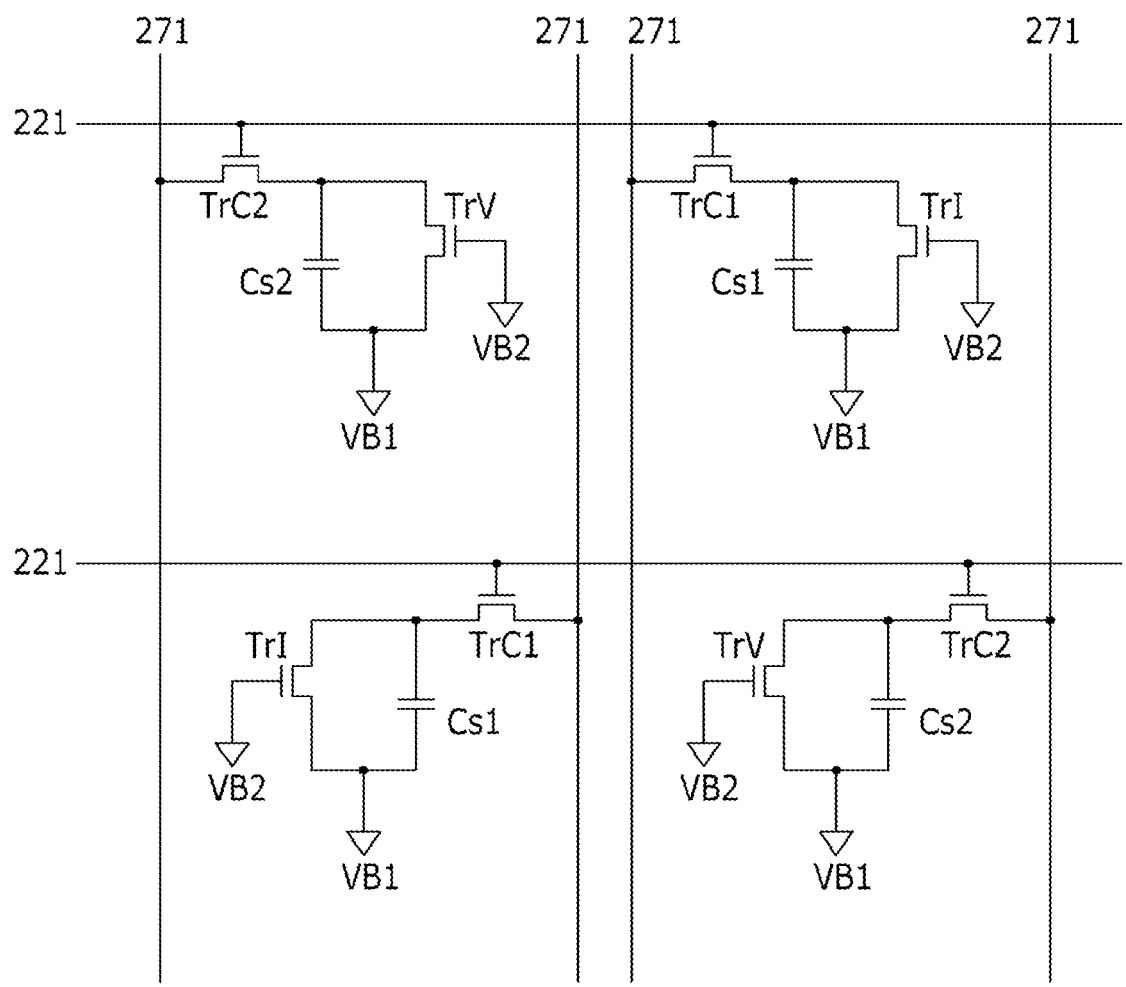
FIG. 1 is a circuit diagram of a touch panel according to an exemplary embodiment of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present.

A touch panel according to an exemplary embodiment of the present invention is described with reference to FIG. 1 to FIG. 2.

FIG. 1 is a circuit diagram of a touch panel according to an exemplary embodiment of the present invention. FIG. 2 is a cross-sectional view showing an infrared sensing transistor, a visible sensing transistor, and a readout transistor of a touch panel according to an exemplary embodiment of the present invention.

Figure 2:
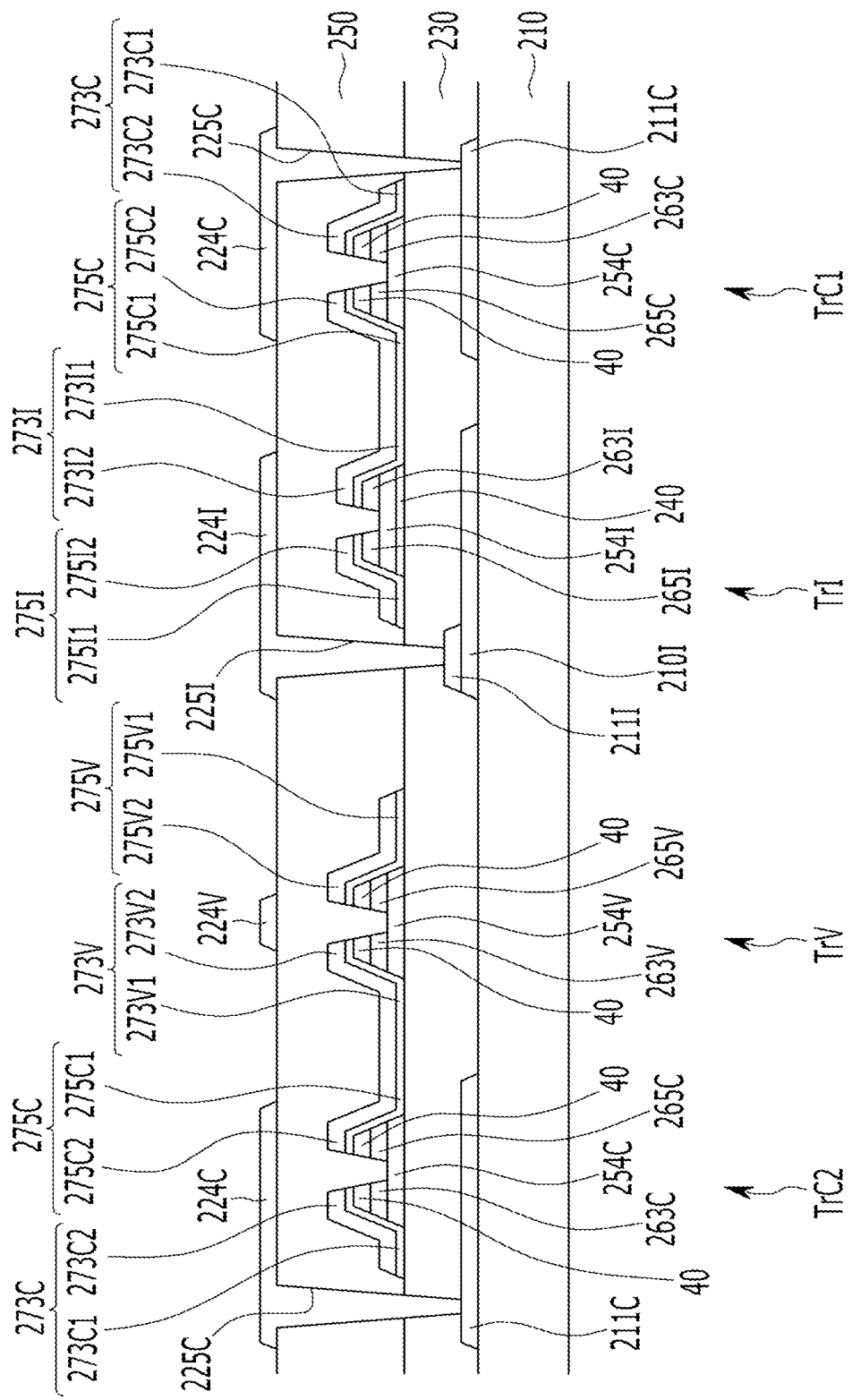
FIG. 2 is a cross-sectional view showing an infrared sensing transistor, a visible sensing transistor, and a readout transistor of a touch panel according to an exemplary embodiment of the present invention.

Referring to FIG. 1 and FIG. 2, a first signal line 271 connected to a readout driving circuit is arranged on a substrate, and a second signal line 221 crossing the first signal line 271 is arranged on the substrate. Readout transistors TrC1 and TrC2 are connected to the first signal line 271 and the second signal line 221.

The readout transistors TrC1 and TrC2 are connected to an infrared sensing transistor TrI or a visible sensing transistor TrV, respectively, with storage capacitors Cs1 and Cs2 therebetween. The infrared sensing transistor TrI and the visible sensing transistor TrV may be distributed over all of the display panel to sense infrared and visible radiation incident on the display panel, and the infrared sensing transistor TrI and the visible sensing transistor TrV may be arranged in a matrix format as shown in FIG. 1. For example, the infrared sensing transistor TrI and the visible sensing transistor TrV may be alternatively arranged, asymmetrically arranged, or arranged according to a ratio of infrared sensing transistors TrI to visible sensing transistors TrV.

When an infrared photon impinges on the infrared sensing transistor TrI, a voltage at Cs1 changes in response to a third signal line VB1 by a generated photocurrent, and a gate signal is applied to the second signal line 221 so that the readout transistor TrC1 is operated to charge the storage capacitor Cs1 with a data voltage transferred to the first signal line 271. In this configuration, the gate signal is applied to a fourth signal line VB2 in order to operate the infrared sensing transistor TrI.

The readout transistor TrC1 for operating the storage capacitor Cs1 may be used to derive X-coordinate and Y-coordinate information of a sensing location within the touch panel.

The touch panel may be attached to a liquid crystal display.

The structure of the touch panel of FIG. 1 is described with reference to FIG. 2.

FIG. 2 is a cross-sectional view showing an infrared sensing transistor, a visible sensing transistor, and a readout transistor of the touch panel of FIG. 1.

As shown in FIG. 2, in the touch panel, an infrared sensing transistor TrI and a visible sensing transistor TrV are disposed on the substrate 210 that may be made of a transparent glass, a plastic, and the like. Readout transistors TrC1 and TrC2 are connected to the infrared sensing transistor TrI and the visible sensing transistor TrV, respectively, to deliver a detection signal. The readout transistors TrC1 and TrC2 may be arranged as a pair with the sensing transistors TrI and TrV, respectively, and may be disposed adjacent and in the same layer as the corresponding sensing transistors TrI and TrV.

The infrared sensing transistor TrI includes a semiconductor 254I, ohmic contacts 263I and 265I, a source electrode 273I, a drain electrode 275I, a passivation layer 250, a bottom gate electrode 211I, and an upper gate electrode 224I.

A light blocking layer 210I is disposed on the substrate 210. The light blocking layer 210I may include material that blocks visible wavelengths occurring outside of the display panel. For example, the light blocking layer 210I may include an amorphous germanium, an amorphous silicon germanium, an amorphous silicon, or an organic material including a black pigment.

The light blocking layer 210I may improve a signal-to-noise ratio (SNR) by blocking a visible wavelength incident on the display panel from an external source and may diminish effects of the visible light on the infrared sensing transistor by optimizing the sensitivity of the semiconductor 254I including the amorphous silicon germanium or the amorphous germanium to infrared wavelengths. Here, the light blocking layer 210I may filter out visible wavelengths while transmitting infrared wavelengths to the infrared sensing transistor TrI.

The bottom gate electrode 211I is disposed on part of the light blocking layer 210I. The bottom gate electrode 211I may be made of a single layer, such as molybdenum, aluminum, etc, or a plurality of layers including the same or similar materials.

An insulating layer 230, which may include insulating material such as silicon nitride, is formed on the bottom gate electrode 211I and the light blocking layer 210I. The thickness of the insulating layer 230 may range from 3,000 Å to 10,000 Å. When the thickness of the insulating layer 230 is 3,000 Å or less, the change of the infrared sensitivity according to the change of a voltage Vgs may be large, and the change of the feature curve of the infrared sensing transistor due to the accumulated available time, and the like may be large as well. When the thickness of the insulating layer 230 is greater than 10,000 Å, the infrared sensing transistor TrI may be not made smaller.

A buffer layer 240 disposed on the insulating layer 230 overlaps the light blocking layer 210I, and the semiconductor 254I is disposed on the buffer layer 240. The semiconductor 254I and the buffer layer 240 may have similar patterns.

The semiconductor 254I may include an amorphous silicon, fine crystalline silicon, an amorphous silicon germanium, or an amorphous germanium, and a single layer or double layer of these materials may be formed. For example, the double layer may have a bottom layer of amorphous silicon and an upper layer of amorphous silicon germanium. To form a double layer, materials having different deposition rates may be used. The lower layer may include a material with a relatively high deposition rate as compared with a material that has a lower deposition rate that forms the upper layer. Materials for the double layer and single layer may be selected to optimize the characteristics of a channel region of the infrared sensing transistor TrI.

The ohmic contacts 263I and 265I are disposed so that they face each other on the semiconductor 254I. The ohmic contacts 263I and 265I may be made of n+ amorphous silicon hydride that is doped with a high concentration of n-type impurities, e.g., phosphorous, or may be made of silicide.

The source electrode 273I and the drain electrode 275I are disposed on the ohmic contacts 263I and 265I, respectively. The source electrode 273I and the drain electrode 265I have bottom layers 273I1 and 275I1 that may be made of titanium and upper layers 273I2 and 275I2 that may be made of copper. Although titanium and copper are indicated here, other metallic and conductive materials may be used.

The passivation layer 250 is formed on the source electrode 273I and the drain electrode 275I. The passivation layer 250 may be made of silicon nitride (SiNx) and similar passivating materials. A contact hole 225I exposes the bottom gate electrode 211I and is formed in the passivation layer 250. The thickness of the passivation layer 250 may be 3,000 Å to 10,000 Å. When the thickness is 3,000 Å or less, the infrared sensitivity of the infrared sensing transistor Tr1 may decrease. When the thickness is greater than 10,000 Å, the infrared sensing transistor Tr1 may not be made smaller.

The upper gate electrode 224I is disposed on the passivation layer 250 in a position overlapping the semiconductor 254I that is disposed between the source electrode 273I and the drain electrode 275I. The upper gate electrode 224I is connected to the bottom gate electrode 211I through the contact hole 225I.

The upper gate electrode 224I overlaps the semiconductor 254I, thereby preventing external visible wavelengths from being transmitted to the semiconductor 254I. Therefore, the sensitivity of the infrared sensing transistor Tr1 may be prevented from decreasing due to the external visible wavelengths.

The light blocking layer 210I may absorb an external photon that may generate a charge, affecting the operation of the transistor. However, operation error of the infrared sensing transistor Tr1 due to the light blocking layer 210I may be suppressed by using bottom gate electrode 211I to apply a gate voltage to the light blocking layer 210I.

Next, the readout transistor TrC1 that is connected to the infrared sensing transistor Tr1 is described.

A source electrode 273C of the readout transistor TrC1 is connected to the drain electrode 275I of the infrared sensing transistor TrI.

The readout transistor TrC1 includes a semiconductor 254C, ohmic contacts 263C and 265C, the source electrode 273C, a drain electrode 275C, the passivation layer 250, a bottom gate electrode 211C, and an upper gate electrode 224C.

The bottom gate electrode 211C is disposed on the substrate 210 and may be made of the same material as the bottom gate electrode 211I of the infrared sensing transistor TrI. A light blocking layer (not shown) similar to the light blocking layer 210I may be formed under the bottom gate electrode 211C.

The insulating layer 230 is formed on the bottom gate electrode 211C, and the semiconductor 254C overlaps with the bottom gate electrode 211C and is formed on the insulating layer 230. The width of the bottom gate electrode 211C is larger than the width of the semiconductor 254C, thereby preventing external light from being incident on the semiconductor 254C. The semiconductor 254C may be made of the same material as a semiconductor 254V of the visible sensing transistor TrV.

The ohmic contacts 263C and 265C form a pair facing each other on the semiconductor 254C and may be made of the same material as the ohmic contacts 263I and 265I of the infrared sensing transistor TrI.

An etch stopping layer 40 is formed on the ohmic contact layers 263C and 265C and may have a similar planar pattern as the ohmic contacts 263C and 265C. The etch stopping layer 40 may prevent damage of the semiconductor 254C of the readout transistor TrC1 when forming the semiconductor 254I of the infrared sensing transistor TrI and may be composed of a material such as titanium.

The source electrode 273C and the drain electrode 275C are disposed on the etch stopping layer 40. The source electrode 273C and the drain electrode 275C may be composed of the same material as the infrared sensing transistor TrI.

The passivation layer 250 is formed on the source electrode 273C and the drain electrode 275C. The passivation layer 250 includes the contact hole 225C that exposes the bottom gate electrode 211C.

The upper gate electrode 224C overlaps the semiconductor 254C and is disposed on the passivation layer 250. The upper gate electrode 224C is connected to the bottom gate electrode 211C through the contact hole 225C. The upper gate electrode 224C prevents the semiconductor 254C from exposure to external photons.

Meanwhile, the visible sensing transistor TrV, which detects visible wavelengths, and the readout transistor TrC2 are a pair and are disposed on the substrate 210. The readout transistor TrC2 is connected to a source electrode 273V of the visible sensing transistor TrV through a drain electrode 275C of the readout transistor TrC2.

The readout transistor TrC2 has a an interlayer structure similar to the readout transistor TrC1 connected to the infrared sensing transistor TrI. In other words, the readout transistor TrC2 may include a semiconductor 254C, ohmic contacts 263C and 265C, a source electrode 273C, a drain electrode 275C, the passivation layer 250, a bottom gate electrode 211C, and an upper gate electrode 224C.

The visible sensing transistor TrV may include a semiconductor 254V, ohmic contacts 263V and 265V, a source electrode 273V, a drain electrode 275V, the passivation layer 250, and a gate electrode 224V.

The semiconductor 254V may be made of an amorphous silicon and is disposed on the insulating layer 230 that is formed on the substrate 210.

The ohmic contacts 263V and 265V are formed as a pair and face each other on the semiconductor 254V. The source electrode 273V and the drain electrode 275V are disposed on the ohmic contacts 263V and 265V. The etch stopping layer 40 is also disposed between the ohmic contacts 263V and 265V, the source electrode 273V, and the drain electrode 275V and may have a similar planar pattern as the ohmic contacts 263V and 265V.

In other words, when forming the semiconductor 254I of the infrared sensing transistor TrI, the semiconductor 254I may be composed of material similar to the etch stopping layer 40 of the readout transistors TrC1 and TrC2 to prevent damage to the semiconductor 254V of the visible sensing transistor TrV.

The passivation layer 250 is disposed on the source electrode 273V and the drain electrode 275V, and the gate electrode 224V overlaps the semiconductor 254V and is formed on the passivation layer 250.

An exemplary embodiment of a method for manufacturing the touch panel according to the above exemplary embodiment is described with reference to FIG. 3, FIG. 4, FIG. 5, FIG. 6, and FIG. 7.

FIG. 3, FIG. 4, FIG. 5, FIG. 6, and FIG. 7 are cross-sectional views sequentially showing process steps involved in manufacturing an infrared sensing transistor, a visible sensing transistor, and a readout transistor according to an exemplary embodiment of the present invention.

Figure 3:
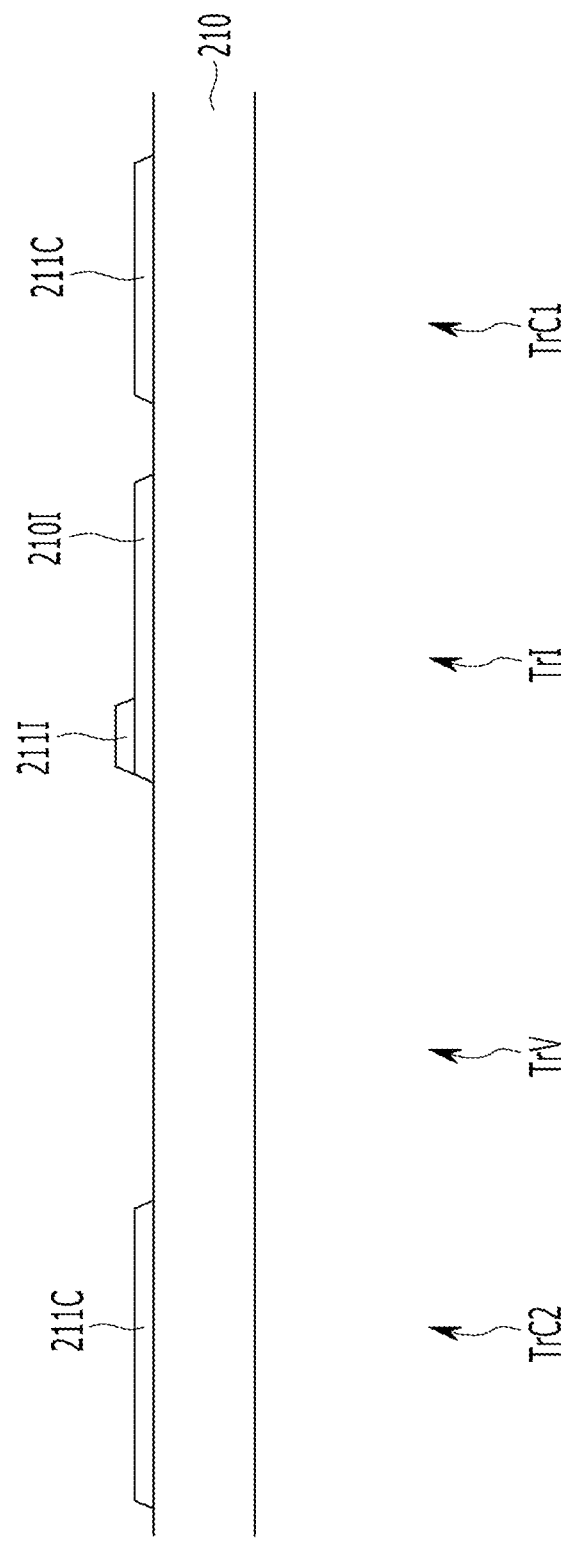
FIG. 3, FIG. 4, FIG. 5, FIG. 6, and FIG. 7 are cross-sectional views sequentially showing process steps involved in manufacturing an infrared sensing transistor, a visible sensing transistor, and a readout transistor according to an exemplary embodiment of the present invention.

As shown in FIG. 3, the light blocking layer 210I is formed on the substrate 210 that may be made of transparent glass, plastic, and the like. The light blocking layer 210I may be made from an organic material and include a black pigment, an amorphous silicon, an amorphous silicon germanium, or an amorphous germanium.

The bottom gate electrode 211I of the infrared sensing transistor TrI and the bottom gate electrode 211C of the readout transistor TrC1 are formed on the light blocking layer 210I and the substrate 210, respectively. The bottom gate electrodes 211C and 211I may be composed of conductors such as molybdenum, aluminum, and the like and may be have a multilayer structure, e.g., molybdenum/aluminum or molybdenum/aluminum/molybdenum.

Figure 4:
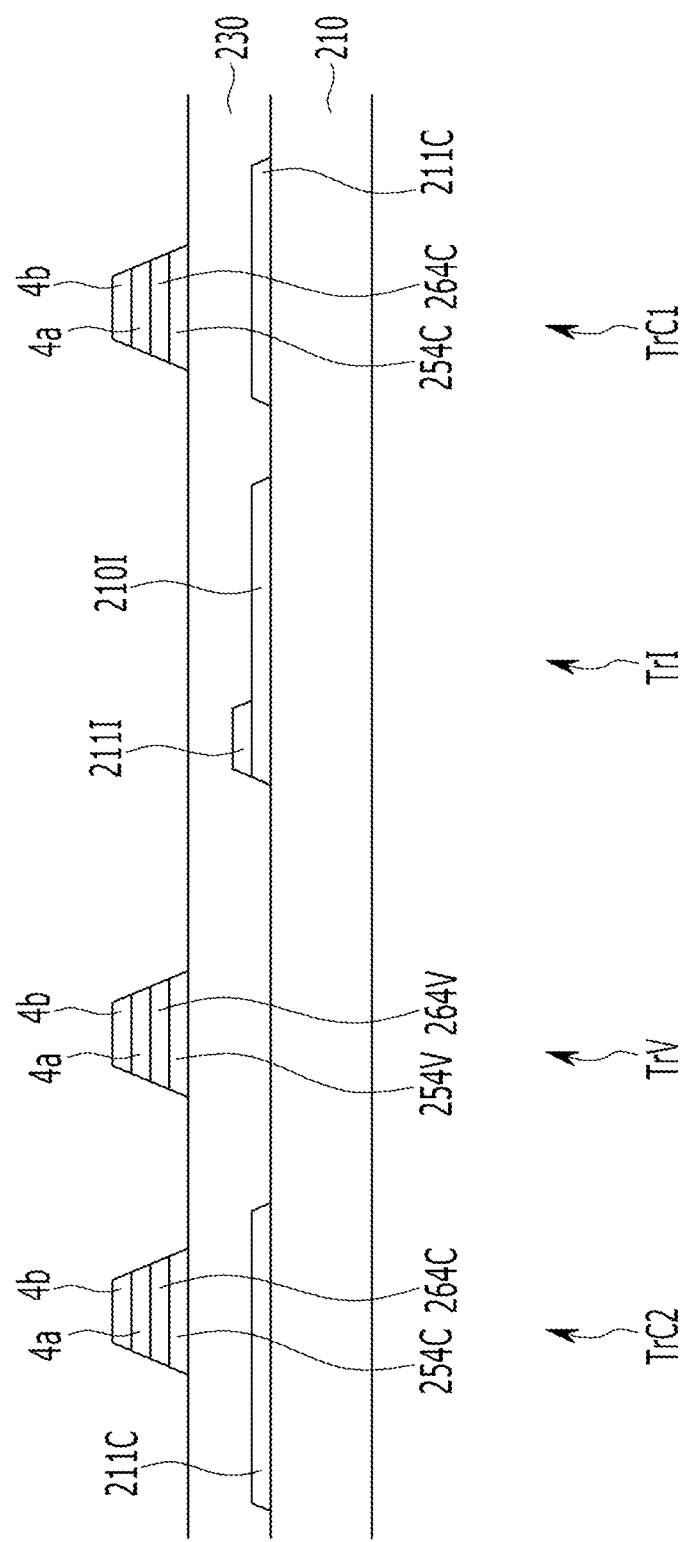

Next, as shown in FIG. 4, the insulating layer 230 is formed on the substrate 210 and having insulating material, e.g., silicon nitride. The thickness of the insulating layer 230 may range from 3,000 Å to 10,000 Å.

Then, an amorphous silicon layer, a silicon layer including a conductive impurity, and etch stopping layer are sequentially deposited on the insulating layer 230.

In this configuration, the thickness of the amorphous silicon layer may be 2,000 Å; the thickness of the silicon layer including the conductive impurity may be 500 Å, and the thickness of the etch stopping layer may be 500 Å or less. The etch stopping layer may be formed as a double layer having a first etch stopping layer that may be composed of titanium and a second etch stopping layer that may be composed of copper, and the sum of the thicknesses of the first etch stopping layer and the second etch stopping layer may be 500 Å or less. For example, when the thickness of the first etch stopping layer is 200 Å, the thickness of the second etch stopping layer may range from 200 Å to 300 Å.

Next, after forming a photosensitive pattern on the etch stopping layer, a first etch stopping pattern 4a and a second etch stopping pattern 4b are formed, e.g., by etching the etch stopping layer by wet etching. The semiconductor 254c and the ohmic contact pattern 264C of the readout transistors TrC1 and TrC2 and the semiconductor 254V and the ohmic contact pattern 264V of the visible sensing transistor TrV are formed by etching the silicon layer and the amorphous silicon layer including conductive impurity by, e.g., dry etching.

Figure 5:
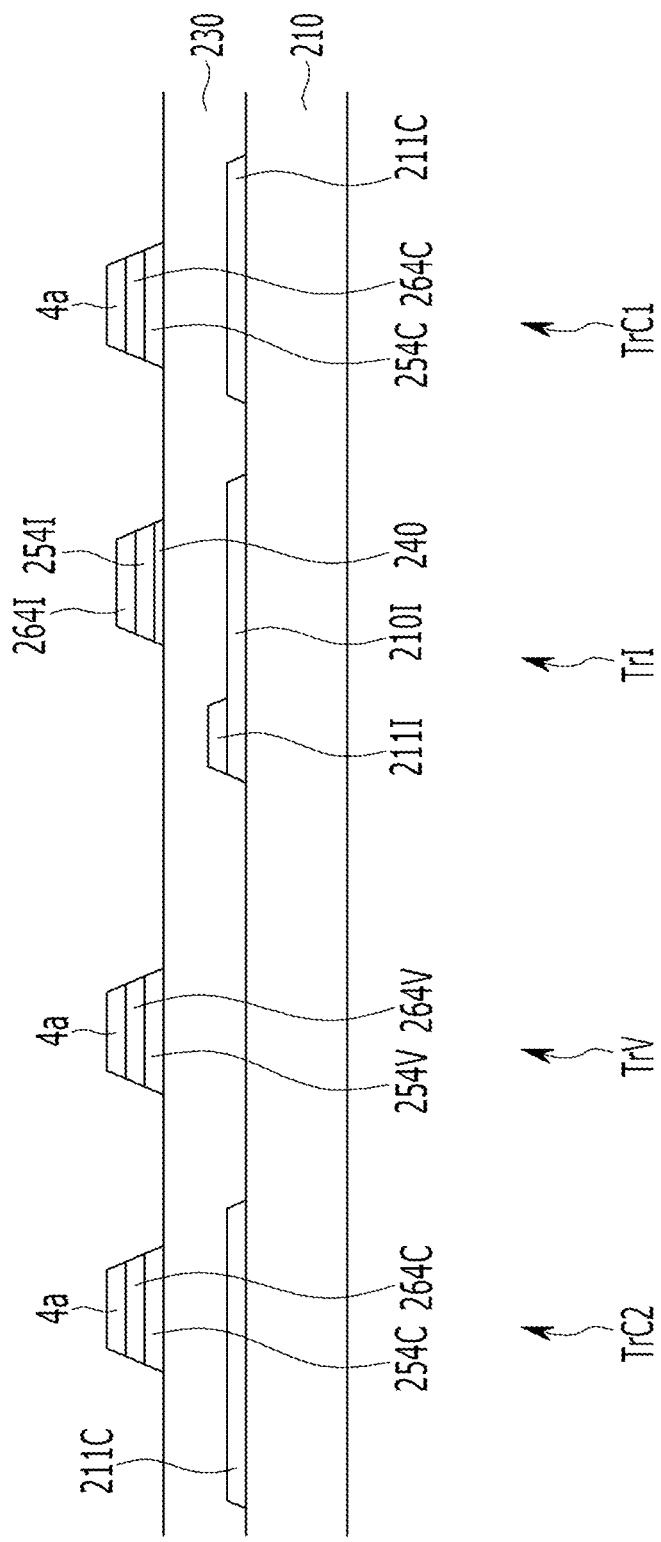

Next, as shown in FIG. 5, a buffer layer 240 that may be composed of silicon nitride, a first silicon layer, and a second silicon layer are formed. The first silicon layer may be composed of an amorphous silicon that may include germanium, and the second silicon layer may be composed of an amorphous silicon layer doped with a conductive impurity.

Thereafter, the second silicon pattern 265I, the first silicon pattern 254I, and the buffer layer 240 are formed by etching the second silicon layer, the first silicon layer, and the buffer layer using the formed photoresist pattern as a mask after forming the photoresist pattern on the second silicon layer.

In this configuration, the second etch stopping pattern is removed, but the first etch stopping pattern 4a is not removed to protect the ohmic contact patterns 264V and 264C and the semiconductors 254C and 254V.

The second etch stopping pattern may be removed in the process of FIG. 4 before forming the buffer layer 240, unlike FIG. 5.

The etch stopping layer may be thinly formed, but when the first etch stopping pattern 4a or the second etch stopping pattern 4b has a thicknesses of 300 Å or less, the pattern may not be formed by etching. Therefore, in an exemplary embodiment of the present invention, the first etch stopping pattern 4a and the second etch stopping pattern 4b may be formed together as a single pattern, and then the second etch stopping pattern 4b may be removed to reduce the thickness of the etch stopping layer. Titanium may be used to compensate for copper that may have poor adhesion characteristics in the bottom layer of this structure.

The etch stopping layer may be formed to have a plurality of layers of molybdenum/aluminum/molybdenum in order to prevent the diffusion of aluminum to the bottom semiconductor 254C. As a result, the etch stopping layer may be thick as compared with a bi-layer format. Due to the difference of etching rates, an undercut caused by over-etching the aluminum in the multilayer may formed. However, when the etch stopping layer is formed with titanium and copper as in the exemplary embodiment of the present invention, an undercut may not be formed by removing the second etch stopping pattern 4b, and the thickness of the etch stopping layer may be minimized.

When the etch stopping layer has a thickness of 500 Å or less, residual amounts of the buffer layer 240 may be decreased. In other words, the etch stopping layer formed in a triple layer of molybdenum/aluminum/molybdenum may prevent diffusion of aluminum to the semiconductor so that the thickness of the etch stopping layer may be at least 1,500 Å. Therefore, the buffer layer 240 may not be completely etched and may be left in a corner or an edge, thereby generating leakage current. The layer that is un-etched may increase as the thickness according to the thickness of the etch stopping layer.

However, when the etch stopping layer is formed to have a thickness of 500 Å or less as in an exemplary embodiment of the present invention, the phenomenon, in which the buffer layer 240 is not completely etched may not occur so that the electrical characteristics of the transistor may be improved.

Figure 6:
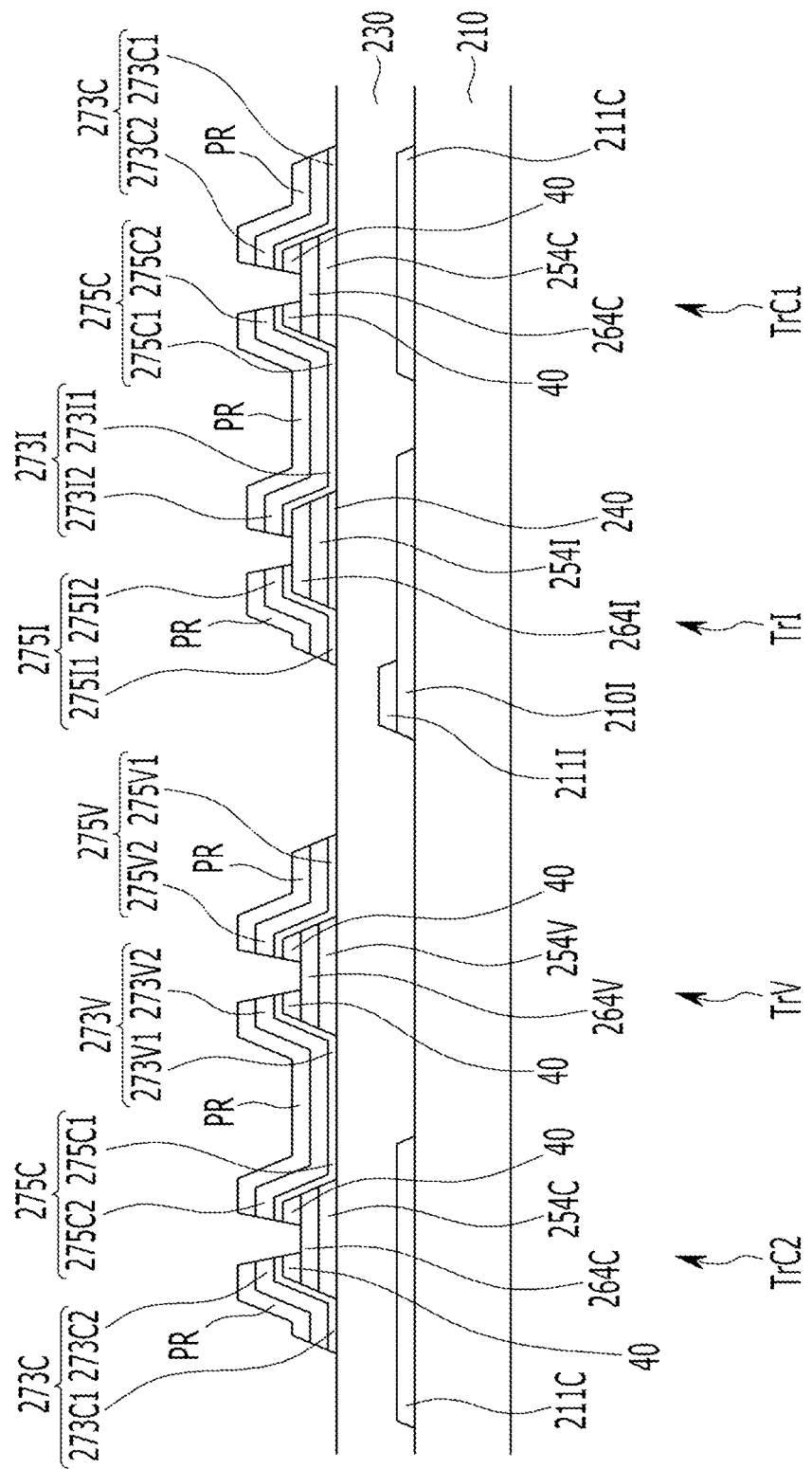

Next, as shown in FIG. 6, a conductive layer is disposed to form the source electrode 273I and the drain electrode 275I on the second silicon pattern 264I, the ohmic contact pattern 264C of the readout transistors TrC1 and TrC2, and the ohmic contact pattern 264V of the visible sensing transistor TrV. In this configuration, the conductive layer may include a bottom layer that may be composed of titanium and an upper layer that may be composed of copper.

Thereafter, the source electrodes 273C, 273V, and 273I and the drain electrodes 275C, 275V, and 275I with bottom layers 273C1, 273V1, 273I1, 275C1, 275V1, and 275I1, and upper layers 273C2, 273V2, 273I2, 275C2, 275V2, and 275I2 may be formed by wet-etching the upper layers and the bottom layers using a photoresist pattern formed on the upper layers (273C2, 273V2, 273I2, 275C2, 275V2, and 275I2) as a mask.

Consecutively, the first etch stopping pattern 4a may be wet-etched to complete the etch stopping layer 40 using the photoresist pattern as the mask, and the second silicon pattern 264I between the source electrode 273I and the drain electrode 275I of the infrared sensing transistor, the ohmic contact pattern 264C of the readout transistors TrC1 and TrC2, and the ohmic contact pattern 264V of the visible sensing transistor TrV are exposed.

Since the thickness of the first etch stopping pattern 4a may be about 200 Å, the first etch stopping pattern 4a may be easily and rapidly removed.

Since the first etch stopping pattern 4a may be composed of the same material as the bottom layers of the source electrodes 273C, 273V, and 273I and the drain electrodes 275C, 275V, and 275I, the first etch stopping pattern 4a of a channel of a thin film transistor may be removed with the same etchant without an additional process when forming the source electrodes 273C, 273V, and 273I and the drain electrodes 275C, 275V, and 275I.

Figure 7:
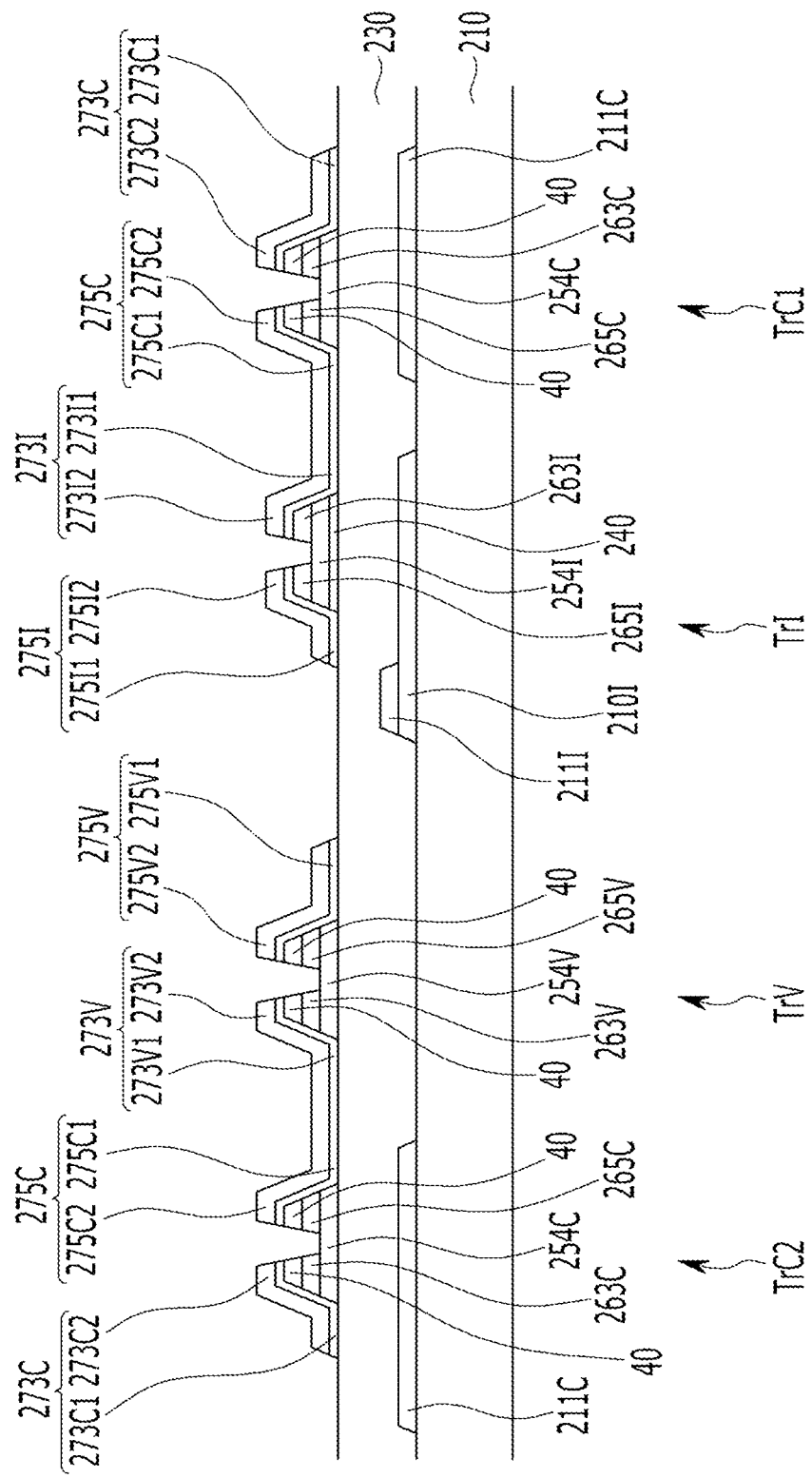

Next, as shown in FIG. 7, after removing the photoresist pattern, the exposed second silicon pattern, the ohmic contact pattern of the readout transistors TrC1 and TrC2, and the ohmic contact pattern of the visible sensing transistor TrV are removed by using the source electrodes 273C, 273V, and 273I and the drain electrodes 275C, 275V, and 275I as the mask. As a result, the ohmic contacts 263I and 265I of the infrared sensing transistor TrI, the ohmic contacts 263C and 265C of the readout transistors TrC1 and TrC2, and the ohmic contacts 263V and 265V of the visible sensing transistor TrV are formed.

In exemplary embodiments of the present invention, since the ohmic contacts 263V, 265V, 263C, and 265C under the first etch stopping pattern 4a are not exposed during the process by leaving the first etch stopping pattern 4a after consecutively depositing the silicon layer including the conductive impurity and the etch stopping layer of the readout transistors TrC1 and TrC2 and the visible sensing transistor TrV, a decrease in the adhesive properties of the ohmic contacts (263V, 265V, 263C, and 265C) may be prevented.

Next, as shown in FIG. 2, the passivation layer 250 is formed on the substrate 210, and the contact hole 225I is formed in the passivation layer 250 by etching. Subsequently, a metal layer is formed on the passivation layer 250 and patterned to form the upper gate electrode 224C of the readout transistors TrC1 and TrC2, the upper gate electrode 224I of the infrared sensing transistor TrI, and the upper gate electrode 224V of the visible sensing transistor TrV.

While this invention has been described by exemplary embodiments, it will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A light sensing transistor, comprising:
   a semiconductor disposed on a substrate;
   an ohmic contact disposed on the semiconductor;
   an etch stopping layer disposed on the ohmic contact;
   a source electrode and a drain electrode both disposed on the etch stopping layer;
   a passivation layer disposed on the source electrode and the drain electrode; and
   a gate electrode disposed on the passivation layer,
   wherein the etch stopping layer, the source electrode, and the drain electrode are comprised of the same material.

2. The light sensing transistor of claim 1, wherein the source electrode and the drain electrode comprise a bottom layer and an upper layer disposed on the bottom layer, and the light sensing transistor senses visible wavelengths.

3. The light sensing transistor of claim 2, wherein the bottom layer and the etch stopping layer both comprise titanium, and the upper layer comprises copper.

4. The light sensing transistor of claim 3, wherein the etch stopping layer has a thickness less than or equal to 300 Å.

5. The light sensing transistor of claim 1, wherein the semiconductor comprises an amorphous silicon, and the light sensing transistor senses visible wavelengths.

6. A display panel, comprising:
a light blocking layer disposed on a substrate;
an insulating layer disposed on the light blocking layer;
a buffer layer and a first light sensing transistor both disposed on the insulating layer; and
a second light sensing transistor disposed on the buffer layer,
wherein the first light sensing transistor comprises:
  a first semiconductor disposed on the insulating layer,
  an ohmic contact disposed on the semiconductor,
  an etch stopping layer disposed on the ohmic contact, and
  a source electrode and a drain electrode both disposed on the etch stopping layer,
wherein the etch stopping layer, the source electrode, and the drain electrode are comprised of the same material, and
wherein the first light sensing transistor and the second light sensing transistor are configured to sense different wavelengths.

7. The display panel of claim 6, wherein the source electrode and the drain electrode comprise a bottom layer and an upper layer disposed on the bottom layer.

8. The display panel of claim 7, wherein the bottom layer and the etch stopping layer both comprise titanium, and the upper layer comprises copper.

9. The display panel of claim 8, wherein the etch stopping layer has a thickness less than or equal to 300 Å.

10. The display panel of claim 6, wherein the etch stopping layer and the ohmic contact have the same pattern.

11. The display panel of claim 6, wherein:
the first semiconductor comprises an amorphous silicon; and
the second light sensing transistor comprises a second semiconductor comprised of a fine crystalline silicon, an amorphous silicon germanium, or an amorphous germanium.

12. The display panel of claim 11, wherein the second semiconductor and the buffer layer have a same pattern.

13. The display panel of claim 6, wherein the second light sensing transistor comprises:
a first gate electrode disposed between the light blocking layer and the insulating layer; and
a second gate electrode electrically connected to the first gate electrode.

14. The display panel of claim 6, wherein the light blocking layer comprises an amorphous germanium or an amorphous silicon germanium.

* * * * *